United States Patent

Ghio et al.

[11] Patent Number: 5,888,836
[45] Date of Patent: Mar. 30, 1999

[54] PROCESS FOR THE REPAIR OF FLOATING-GATE NON-VOLATILE MEMORIES DAMAGED BY PLASMA TREATMENT

[75] Inventors: Emilio Ghio; Simone Alba, both of Milan; Andrea Colognese, Padua, all of Italy

[73] Assignee: SGS-Thomson Microelectronics S.r.l., Agrate Brianza, Italy

[21] Appl. No.: 990,328

[22] Filed: Dec. 15, 1997

[30]     Foreign Application Priority Data

Dec. 16, 1996  [EP]  European Pat. Off. .............. 96830624

[51] Int. Cl.⁶ .................................................. H01L 21/268
[52] U.S. Cl. .............................. 438/4; 438/594; 438/257; 438/308
[58] Field of Search .................... 438/257, 264, 438/593, 594, 4, 308, 910, 795, 972; 148/4

[56]            References Cited

U.S. PATENT DOCUMENTS

| | | | |
|---|---|---|---|
| 4,916,082 | 4/1990 | Lesk et al. | 438/516 |
| 5,254,497 | 10/1993 | Liu | 438/384 |
| 5,279,981 | 1/1994 | Fukatsu et al. | 437/43 |
| 5,587,330 | 12/1996 | Yamazaki | 438/162 |
| 5,656,521 | 8/1997 | Hamilton et al. | 438/4 |

FOREIGN PATENT DOCUMENTS

| | | |
|---|---|---|
| 0 408 054 A2 | 1/1991 | European Pat. Off. . |
| 59-184569 | 10/1984 | Japan . |
| 63-182826 | 7/1988 | Japan . |
| 63-316439 | 12/1988 | Japan . |
| 4-246865 | 9/1992 | Japan . |

*Primary Examiner*—Olik Chaudhuri
*Assistant Examiner*—Daniel H. Mao
*Attorney, Agent, or Firm*—Jenkens & Gilchrist

[57]            ABSTRACT

The process described requires the formation of floating-gate non-volatile memory cells entirely similar in structure to those produced by known processes. The process comprises an annealing treatment at relatively low temperature (430° C.) to repair damage due to plasma treatments. To obtain threshold voltage values for the cells close to the theoretical values, especially for cells with particularly extended interconnections, the cells are subjected to ultra-violet radiation before the annealing treatment, in order to neutralize any electrical charges present in the floating-gate electrodes of the cells.

9 Claims, 1 Drawing Sheet

PROCESS FOR THE REPAIR OF FLOATING-GATE NON-VOLATILE MEMORIES DAMAGED BY PLASMA TREATMENT

FIELD OF THE INVENTION

The present invention relates to the manufacture of semiconductor electronic devices and, more particularly, to a process for the manufacture of a floating-gate non-volatile memory on a monocrystalline silicon substrate.

BACKGROUND OF THE INVENTION

It is known that in certain manufacturing processes, treatments of silicon wafers, in which electronic devices are formed, generate electrical potentials on the wafer which may damage the active dielectrics of the electronic components being manufactured. In particular, the thin layers of silicon dioxide which form the gate dielectrics of MOS field-effect transistors and the gate dielectrics of cells of programmable non-volatile memories, for example, EPROM, EEPROM and "flash" memories, may be damaged. This may result in the production of electronic components whose electrical characteristics are degraded with respect to those theoretically obtainable. The treatments most responsible for this damage are those which require the use of plasmas for dry etching or for certain operations of chemical deposition from the vapor phase (plasma enhanced CVD).

To repair such damage, a known method of using high-temperature annealing treatments has been used. However, it is not always possible to use sufficiently high temperatures to ensure the restoration of the properties of the dielectrics. Indeed, in practically all processes, it is necessary to form on the substrate at least one layer of material which sets a maximum limit to the temperatures which can be used in the subsequent operations. A case in point is that of the layers of aluminum required to form interconnecting paths on one or more levels; these impose a temperature limit of approximately 450° C.

It is also known that certain annealing treatments are sufficiently effective, even at relatively low temperatures. For example, certain defects of the dielectrics of MOS devices at the interface with the substrate can be largely eliminated by heating to 400°–450° C. in a hydrogen-containing atmosphere. The defects in question are those caused by silicon atoms which have a free bond at the interface with the dielectric and therefore tend to trap electrons. This causes a change in the theoretical electrical characteristics of the devices, for example, an increase in the threshold voltage of MOS transistors with respect to the design value. With the aforesaid treatment, within the stated temperature range the hydrogen reacts with the silicon atoms with a free bond to saturate the states at the interface between dielectric and silicon and impede the trapping of electrons.

It has been found that this annealing treatment, although effective in MOS transistors, enabling threshold voltage values very close to the theoretical values to be obtained does not have the same effect on floating-gate non-volatile memory cells, although these are structurally and functionally similar to MOS transistors, particularly in cells whose control gate electrodes are connected to particularly long connecting paths. Indeed, if the threshold voltage of a memory cell is measured after the annealing treatment described above and after an appropriate erasure treatment by ultraviolet (UV) radiation, which has the purpose of rebalancing any excess charges in the floating-gate electrode caused by the manufacturing process, values higher than those expected according to the design parameters are found. These results have been documented, for example, in the article by H. Fang et al., in International Electronic Device Meeting, 1994, page 467.

Therefore, what is needed is an improvement to the manufacturing process of a floating-gate non-volatile memory with memory cells to avoid the aforementioned prior art problems so that the memory cells may have threshold voltage values equal, or at least very close, to the theoretical values.

SUMMARY OF THE INVENTION

Accordingly, a process for the manufacture of a floating-gate non-volatile memory on a monocrystalline silicon substrate is provided. The process includes the steps of forming in the substrate pairs of planar regions separated by a channel and designed to form source and drain regions of cells of the memory, forming on the substrate a gate dielectric and a floating-gate electrode made of polycrystalline silicon for each cell and at least one layer of a material which sets a maximum limit on the temperatures which can be used in the subsequent steps of the process, and subjecting the substrate, after the formation of the layer, to at least one treatment which causes alterations in the gate dielectrics and to a subsequent annealing treatment at a temperature below the maximum limit. After the treatment which causes alterations and before the annealing treatment, the substrate is subjected to ultraviolet radiation whose intensity and duration are such that any negative charges present in the floating-gate electrodes of the cells are neutralized.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The invention will be more easily understood from the following description of one of its embodiments, provided by way of non-limiting example in relation to the attached drawing, in which.

DETAILED DESCRIPTION OF A PREFERRED EMBODIMENT OF THE INVENTION

Figure 1:
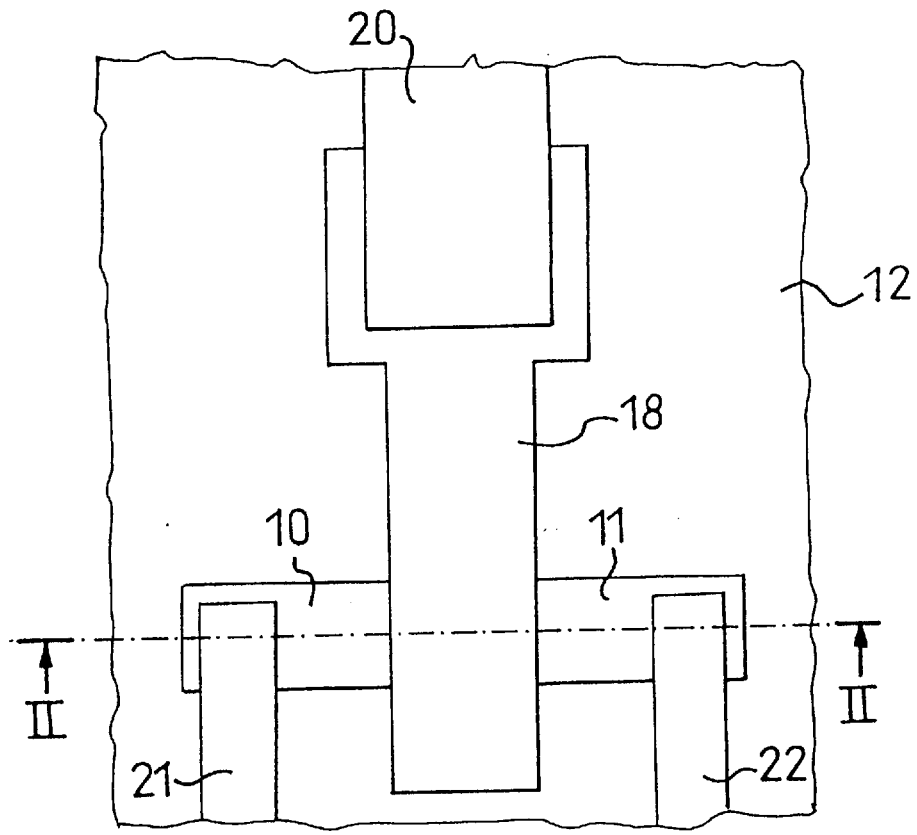
FIGS. 1 and 2 show, in a plan and sectional view respectively, a memory cell which may be made by the process according to the invention.
Figure 2:
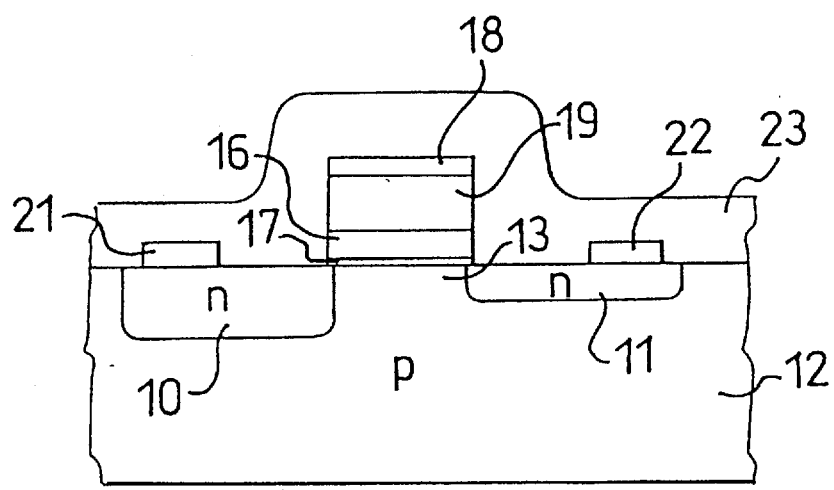

A known process for the manufacture of floating-gate non-volatile memory cells in an integrated circuit requires the formation of pairs of planar regions doped with n-type impurities, designed to form the source and drain regions of the memory cells, on a monocrystalline silicon substrate 12 doped with p-type impurities. FIGS. 1 and 2 show a single "flash" memory cell, but a cell of any floating-gate non-volatile memory could be shown in its place.

A thin layer of silicon dioxide 17 acting as the gate dielectric, a floating-gate electrode 16 made of polycrystalline silicon, and a control gate electrode 18 separated from the floating-gate electrode by a relatively thick layer of dielectric 19 are formed by known photolithographic techniques between the source and drain regions, numbered 10 and 11 respectively in the drawing, and precisely above the channel 13 which they delimit.

The control gate electrode 18 is formed from a layer of aluminum, suitably deposited and treated by known photolithographic techniques, from which are also formed any necessary interconnecting paths between the components of the integrated circuit in which the memory is formed. The figures show only contact strips, indicated by the numbers 20, 21 and 22, for connection, respectively, to the control gate electrode 18 and to the source and drain regions 10 and 11.

The known process may also require the formation of further metallic paths, which are not shown, by formation from other metallic layers deposited on different levels insulated from each other.

The operations required to obtain the structure illustrated and described in a summary way above comprise treatments, for example, plasma etching for the formation of the interconnecting metallic paths, which cause alterations in the dielectrics of the devices. In order to repair, among other things, the damage caused by these treatments, the known process requires annealing in a hydrogen-containing atmosphere at approximately 430° C. after the formation of the final level of deposited metal.

The process continues with the formation of a layer 23 of dielectric material for the final insulation and passivation of the integrated circuit, the opening of windows in this layer and the formation of superficial contacts and metallic areas (pads) for the connection of the electronic devices of the integrated circuit to the outside. Finally, the structure is subjected to ultraviolet radiation for the "erasure" of the memory cells.

According to the invention, the process described above is modified by the introduction of an ultraviolet radiation treatment after the last treatment which may cause alterations in the dielectrics and before the annealing in a hydrogen-containing atmosphere. The intensity and duration of the radiation depend on the thicknesses and geometries of the structure and are selected in such a way as to neutralize as far as possible any negative charges present in the floating-gate electrodes and are, in practice, identical to those used for the erasure of the memory in the finished device.

Measurements made at the end of the process according to the invention demonstrated that the threshold voltage values of the memory cells were substantially equal to the theoretical design values. A hypothetical explanation of the physical phenomena responsible for the improved performance, at least in respect of the threshold voltage, is as follows.

In the known process, during the annealing treatment the diffusion of H+ hydrogen ions towards the oxide/silicon interface is vigorously opposed by the strong electrical field produced by the electrons trapped in the floating gate as a result of the plasma treatments, and therefore these ions do not contribute to the passivation process at the interface between the silicon substrate and gate oxide, which is therefore incomplete. With the preliminary erasure treatment according to the invention, however, the electrons trapped in the floating-gate electrodes are neutralized so that the subsequent annealing treatment is able to have its full effect, since there is no longer an electrical field opposing the diffusion of hydrogen ions towards the oxide/silicon gate interface.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A process for the manufacture of a floating-gate nonvolatile memory on a monocrystalline silicon substrate, comprising the steps of:

forming in the substrate pairs of planar regions, separated by a channel and designed to form source and drain regions of cells of the memory;

forming on the substrate a gate dielectric and a floating-gate electrode made of polycrystalline silicon for each cell, and at least one layer of a material which sets a maximum limit on the temperatures which can be used in the subsequent steps of the process;

subjecting the substrate, after the formation of the layer, to at least one treatment which causes alterations in the gate dielectrics and to a subsequent annealing treatment in a hydrogen-containing atmosphere at a temperature below the maximum limit; and after the treatment which causes alterations and before the annealing treatment, subjecting the substrate to ultraviolet radiation whose intensity and duration are such that any negative charges present in the floating-gate electrodes of the cells are neutralized.

2. The process, according to claim 1, wherein the treatment which causes alterations is a plasma treatment.

3. The process, according to claim 2, wherein the formation of at least one layer which sets a maximum limit on the temperatures comprises the deposition of a layer of aluminum.

4. The process, according to claim 2, wherein the annealing treatment is carried out at a temperature of approximately 430° C.

5. The process, according to claim 2, wherein the formation of at least one layer which sets a maximum limit on the temperatures comprises the deposition of a layer of aluminum.

6. The process, according to claim 5, wherein the annealing treatment is carried out at a temperature of approximately 430° C.

7. The process, according to claim 2, wherein the annealing treatment is carried out at a temperature of approximately 430° C.

8. The process, according to claim 1, wherein the formation of at least one layer which sets a maximum limit on the temperatures comprises the deposition of a layer of aluminum.

9. The process, according to claim 1, wherein the annealing treatment is carried out at a temperature of approximately 430° C.

* * * * *